(12) United States Patent
Zhai et al.

(10) Patent No.: US 11,990,913 B2
(45) Date of Patent: May 21, 2024

(54) SYSTEMS AND METHODS FOR PROVIDING A DELAY-LOCKED LOOP WITH COARSE TUNING TECHNIQUE

(71) Applicant: Apple Inc., Cupertino, CA (US)

(72) Inventors: Chen Zhai, San Diego, CA (US);
Abbas Komijani, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 18/079,424

(22) Filed: Dec. 12, 2022

(65) Prior Publication Data

US 2024/0106440 A1    Mar. 28, 2024

Related U.S. Application Data

(60) Provisional application No. 63/409,190, filed on Sep. 22, 2022.

(51) Int. Cl.
*H03L 7/081*    (2006.01)
*H03L 7/085*    (2006.01)

(52) U.S. Cl.
CPC .......... *H03L 7/0818* (2013.01); *H03L 7/085* (2013.01)

(58) Field of Classification Search
CPC ............................. H03L 7/0818; H03L 7/085
See application file for complete search history.

(56) References Cited

U.S. PATENT DOCUMENTS

| 3,416,096 | A | * | 12/1968 | Kim ........................ | H03L 7/23 331/25 |
| 4,103,234 | A | * | 7/1978 | Frazier, Jr. ....... | G11B 20/10194 375/360 |
| 4,635,000 | A | * | 1/1987 | Swanberg .............. | H03L 7/089 331/25 |
| 4,663,523 | A | * | 5/1987 | Swanberg .............. | H04N 1/053 348/203 |
| 4,694,156 | A | * | 9/1987 | Swanberg .............. | H04N 1/053 250/236 |

(Continued)

FOREIGN PATENT DOCUMENTS

| KR | 2019099947 A | | 8/2019 |
| KR | 20190099947 A | * | 8/2019 |
| KR | 20230007817 A | * | 1/2023 |

*Primary Examiner* — Adam D Houston
(74) *Attorney, Agent, or Firm* — FLETCHER YODER PC

(57) ABSTRACT

To increase the operating frequency range of the DLL while decreasing varactor sizes, coarse tuning circuitry may be implemented in a delay-locked loop (DLL). The DLL may include a voltage-controlled delay line (VCDL) including multiple switched capacitors coupled in parallel to each other. An electrical ground may be coupled to the parallel switched capacitors at a first node and a buffer and variable capacitor may be coupled to the parallel switched capacitors at a second node. The coarse tuning circuitry may be electrically coupled to a phase detector and to the multiple switched capacitors of the VCDL, such that the coarse tuning circuitry may receive a signal (e.g., an indication of a phase) from the phase detector and may adjust switched capacitor loading based on the signal received from the phase detector. Such a DLL implementation may increase DLL tuning range and decrease phase noise, among other advantages.

20 Claims, 7 Drawing Sheets

(56) References Cited

U.S. PATENT DOCUMENTS

| | | | | |
|---|---|---|---|---|
| 5,013,932 A * | 5/1991 | Smith | ................ | H04L 25/0272 |
| | | | | 327/306 |
| 5,200,751 A * | 4/1993 | Smith | ...................... | G06J 1/00 |
| | | | | 341/147 |
| 7,579,889 B2 * | 8/2009 | Yang | .................... | H03L 7/0816 |
| | | | | 327/158 |
| 7,932,784 B1 * | 4/2011 | Janesch | .................. | H03L 7/091 |
| | | | | 331/10 |
| 8,223,239 B2 * | 7/2012 | Senda | ................... | H04N 25/00 |
| | | | | 348/312 |
| 8,854,099 B1 | 10/2014 | Botao | | |
| 9,147,376 B2 | 9/2015 | Lee | | |
| 9,559,792 B1 * | 1/2017 | Amir-Aslanzadeh | ....................... | |
| | | | | H04B 17/12 |
| 9,680,480 B1 * | 6/2017 | Fredenburg | ............. | H03L 7/099 |
| 9,705,516 B1 * | 7/2017 | Fredenburg | .......... | H03B 5/1243 |
| 9,762,249 B1 * | 9/2017 | Faisal | .................. | H03L 7/0998 |
| 11,239,846 B1 * | 2/2022 | ur Rahman | ............ | H03L 7/089 |
| 11,418,199 B1 * | 8/2022 | Cherniak | ............. | H03L 7/087 |
| 11,451,219 B2 * | 9/2022 | Shang | ................ | H03K 5/00 |
| 2007/0293163 A1 * | 12/2007 | Kilpatrick | ........... | H04L 27/0008 |
| | | | | 455/84 |
| 2008/0111601 A1 * | 5/2008 | Lee | ........................ | H03L 7/085 |
| | | | | 327/160 |
| 2008/0111653 A1 * | 5/2008 | Lee | ........................ | H03K 5/131 |
| | | | | 333/24 R |
| 2008/0207146 A1 * | 8/2008 | Marath | .................. | H04B 1/123 |
| | | | | 455/114.2 |
| 2008/0273579 A1 * | 11/2008 | Rofougaran | ......... | H01Q 21/062 |
| | | | | 375/E7.002 |
| 2010/0207693 A1 * | 8/2010 | Fagg | .................... | H03L 7/1976 |
| | | | | 331/10 |
| 2010/0321115 A1 * | 12/2010 | Mohajeri | ............ | H04L 25/0286 |
| | | | | 330/297 |
| 2012/0062331 A1 * | 3/2012 | Ravi | ..................... | H03K 5/133 |
| | | | | 332/144 |
| 2013/0121504 A1 * | 5/2013 | Adams | .................. | H04R 3/005 |
| | | | | 381/369 |
| 2014/0264050 A1 * | 9/2014 | Rostaing | ............. | H03H 11/265 |
| | | | | 250/371 |
| 2016/0315601 A1 * | 10/2016 | Gu | ...................... | H03H 9/02535 |
| 2016/0373101 A1 * | 12/2016 | Dong | ................... | H03H 7/30 |
| 2018/0034468 A1 * | 2/2018 | Faisal | .................. | H03L 7/0998 |
| 2018/0183413 A1 * | 6/2018 | Wong | ................... | H03L 7/0997 |
| 2019/0361102 A1 * | 11/2019 | Price | ................... | G01S 15/8915 |
| 2020/0381998 A1 * | 12/2020 | McKenzie | ........... | G06F 1/3287 |

* cited by examiner

SYSTEMS AND METHODS FOR PROVIDING A DELAY-LOCKED LOOP WITH COARSE TUNING TECHNIQUE

CROSS-REFERENCE TO RELATED APPLICATIONS

This application claims priority to U.S. Provisional Application No. 63/409,190, filed Sep. 22, 2022, entitled "SYSTEMS AND METHODS FOR PROVIDING A DELAY-LOCKED LOOP WITH COARSE TUNING TECHNIQUE," the disclosure of which is incorporated by reference in its entirety for all purposes.

BACKGROUND

The present disclosure relates generally to wireless communication, and more specifically to shifting phases in wireless signals.

In a wireless communication device, delay-locked loops (DLLs) may be used to change the phase of a clock signal (e.g., to phase lock an input and an output signal, which may prevent or mitigate phase error). It may be advantageous to achieve a wide operating frequency range for the DLL, which may be accomplished by increasing a size of a varactor. However, increasing varactor size may consume excessive space and may lead to increased phase noise.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a delay-locked loop may include a phase detector, a loop filter coupled to the phase detector, a voltage-controlled delay line (VCDL) electrically coupled to the loop filter and including a plurality of switched capacitors.

In another embodiment, a method includes receiving an indication of a phase of an input signal from a phase detector; activating, via tuning circuitry, a first plurality of switches based on the indication of the phase to electrically couple a first plurality of capacitors to a first plurality of buffers to adjust a phase delay; and inputting the input signal to the first plurality of buffers to apply the phase delay.

In yet another embodiment, a device includes a plurality of antennas; and a transceiver coupled to the plurality of antennas, the transceiver including a phase detector; a loop filter coupled to the phase detector, a voltage-controlled delay line (VCDL) electrically coupled to the loop filter and including a plurality of switched capacitors, and coarse tuning circuitry electrically coupled to the phase detector and the VCDL, the coarse tuning circuitry configured to apply a first adjustment to an output signal of the VCDL by adjusting the plurality of switched capacitors based on an output of the phase detector.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
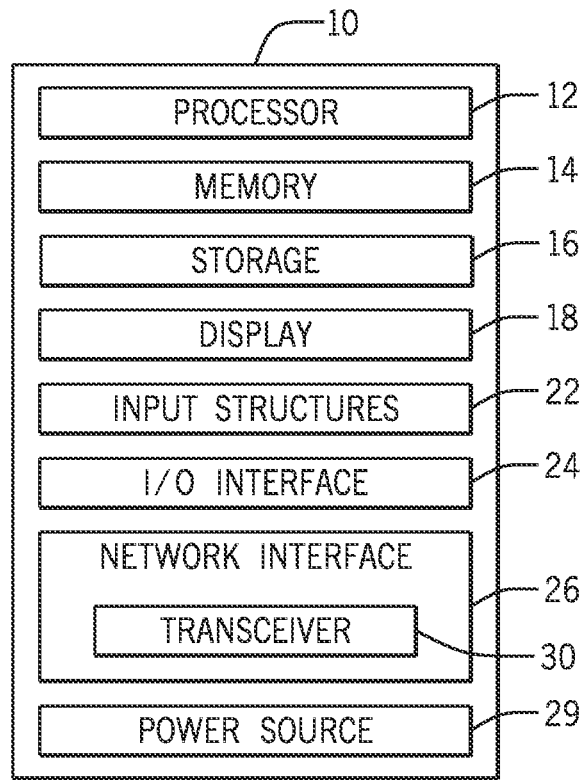
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on. Additionally, the term "set" may include one or more. That is, a set may include a unitary set of one member, but the set may also include a set of multiple members.

Delay-locked loops (DLLs) may be used in electronic circuits to change the phase of a clock signal (e.g., to phase lock an input and an output signal, which may prevent or mitigate phase error). In some cases, a DLL may include a phase detector, a loop filter, and a voltage controlled delay line (VCDL), where the VCDL may delay the input signal and the phase detector and the loop filter may control a phase relationship between the input/output. The VCDL may include multiple delay stages including a buffer (e.g., an inverter or the like) and a varactor or other variable capacitor (e.g., such as a variable polarized capacitor). To increase an operating frequency range of the DLL, the size of the varactors may be increased. However, increasing the size of the varactor may consume excessive space on the DLL circuitry and may lead to increased phase noise.

In an embodiment of the present disclosure, to increase the operating frequency range of the DLL while decreasing varactor sizes, as well as to achieve other desirable advantages, coarse tuning circuitry may be implemented in the DLL. The VCDL may include multiple switched capacitors (e.g., multiple capacitors each coupled to a corresponding switch) coupled in parallel to each other. An electrical ground may be coupled to the parallel switched capacitors at a first node and a buffer and varactor or other variable capacitor may be coupled to the parallel switched capacitors at a second node.

The coarse tuning circuitry (e.g., a coarse tuning engine) may be electrically coupled to a phase detector and to a VCDL and to the multiple switched capacitors, such that the coarse tuning circuitry may receive a signal (e.g., an indication of a phase) from the phase detector and may adjust switched capacitor loading (e.g., by closing certain switches of the switched capacitors and/or opening certain switches of the switched capacitors) based on the signal received from the phase detector. Such a DLL implementation may increase DLL tuning range, decrease phase noise and duty cycle distortion (e.g., due to varactor), may mitigate or eliminate DLL false locking issues, and may improve DLL settling time, among other advantages.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic).

The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive signals between one another. It should be noted that FIG. 1 is merely one example of a particular implementation and is intended to illustrate the types of components that may be present in the electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, a local area network (LAN) or wireless local area network (WLAN), such as a network employing one of the IEEE 802.11x family of protocols (e.g., WI-FI®), and/or a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a $6^{th}$ generation (6G) or greater than 6G cellular network, a satellite network, a non-terrestrial network, and so on. In particular, the network interface 26 may include, for example, one or more interfaces for using a cellular communication standard of the 5G specifications that include the millimeter wave (mm-Wave) frequency range (e.g., 24.25-300 gigahertz (GHz)) that defines and/or enables frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
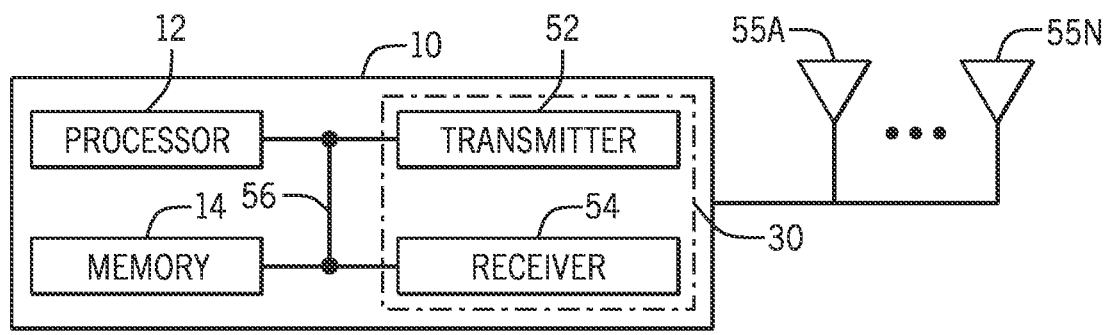
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive signals between one another.

The electronic device 10 may include the transmitter 52 and/or the receiver 54 that respectively enable transmission and reception of signals between the electronic device 10 and an external device via, for example, a network (e.g., including base stations or access points) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with one or more beams and various configurations. In some embodiments, multiple antennas of the antennas 55A-55N of an antenna group or module may be communicatively coupled to a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
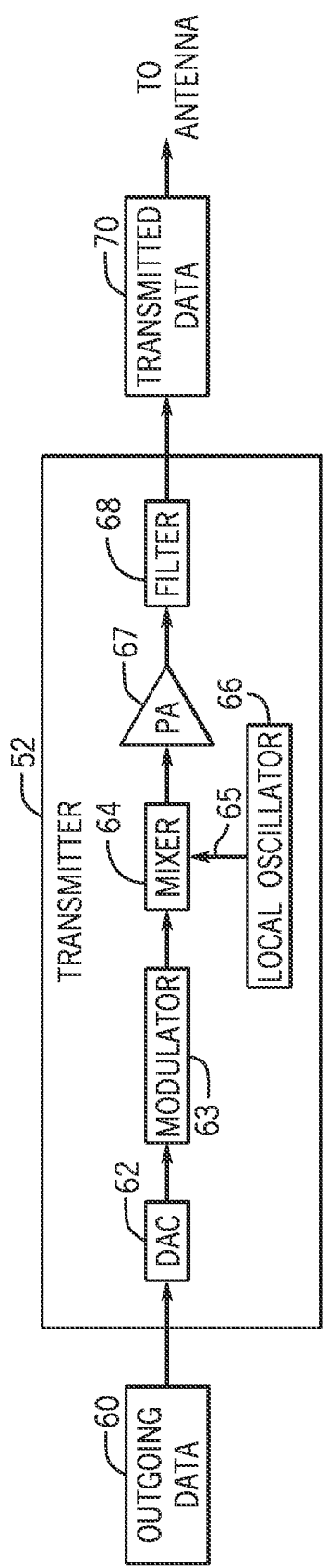
FIG. 3 is a schematic diagram of a transmitter of the electronic device of FIG. 1, according to embodiments of the present disclosure.

As mentioned above, the transceiver 30 of the electronic device 10 may include a transmitter and a receiver that are coupled to at least one antenna to enable the electronic device 10 to transmit and receive wireless signals. FIG. 3 is a block diagram of a transmitter 52 (e.g., transmit circuitry) that may be part of the transceiver 30, according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 63 may combine the converted analog signal with a carrier signal. A mixer 64 may combine the carrier signal with a local oscillator signal 65 (which may include quadrature component signals) from a local oscillator 66 to generate a radio frequency signal. A power amplifier (PA) 67 receives the radio frequency signal from the mixer 64, and may amplify the modulated signal to a suitable level to drive transmission of the signal via the one or more antennas 55. A filter 68 (e.g., filter circuitry and/or software) of the transmitter 52 may then remove undesirable noise from the amplified signal to generate transmitted data 70 to be transmitted via the one or more antennas 55. The filter 68 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include an additional mixer and/or a digital up converter (e.g., for converting an input signal from a baseband frequency to an intermediate frequency). As another example, the transmitter 52 may not include the filter 68 if the power amplifier 67 outputs the amplified signal in or approximately in a desired frequency range (such that filtering of the amplified signal may be unnecessary).

Figure 4:
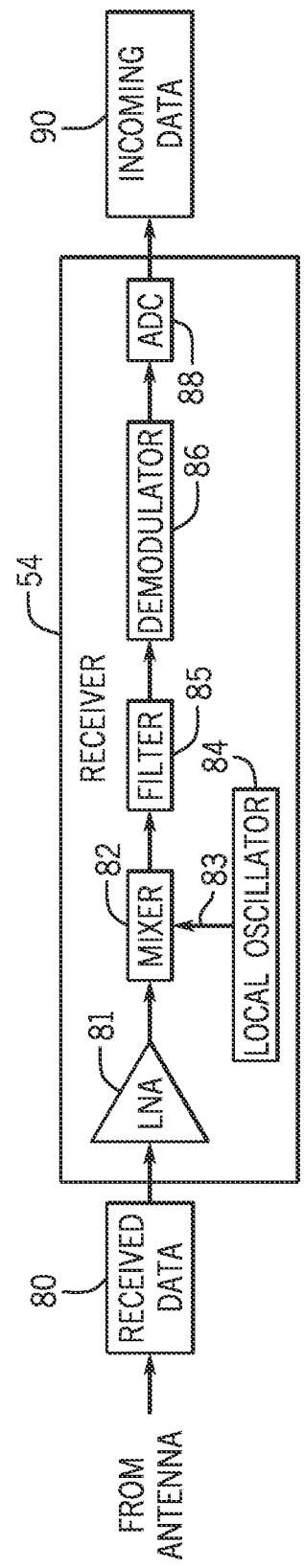
FIG. 4 is a schematic diagram of a receiver of the electronic device of FIG. 1, according to embodiments of the present disclosure.

FIG. 4 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may combine the amplified signal with a local oscillator signal 83 (which may include quadrature component signals) from a local oscillator 84 to generate an intermediate or baseband frequency signal. A filter 85 (e.g., filter circuitry and/or software) may remove undesired noise from the signal, such as cross-channel interference. The filter 85 may also remove additional signals received by the one or more antennas 55 that are at frequencies other than the desired signal. The filter 85 may include any suitable filter or filters to remove the undesired noise or signals from the received signal, such as a bandpass filter, a bandstop filter, a low pass filter, a high pass filter, and/or a decimation filter. A demodulator 86 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

Figure 5:
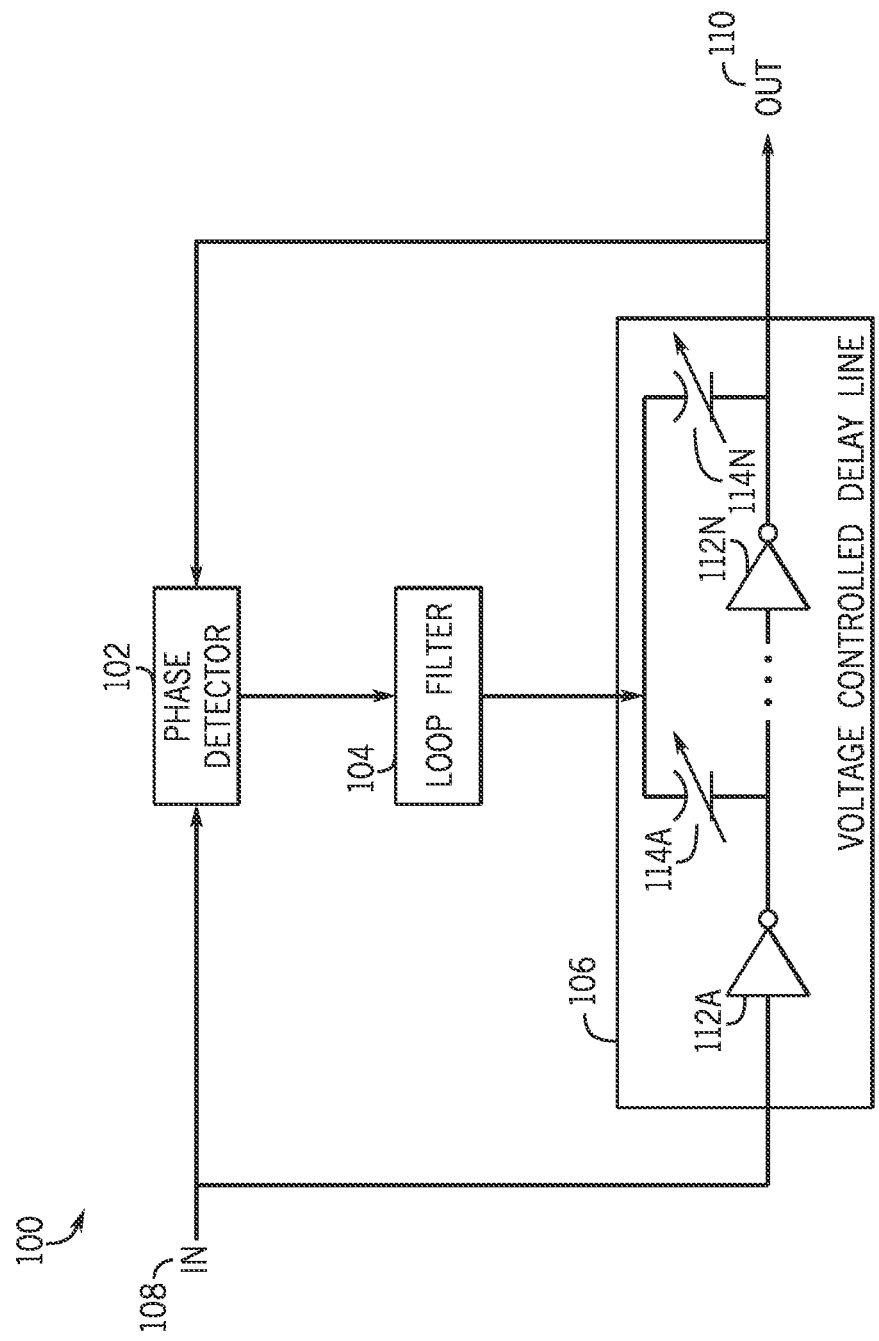
FIG. 5 is a schematic diagram of a delay-locked loop (DLL) that may be used in the electronic device of FIG. 1 to change the phase of a clock signal.

FIG. 5 is a schematic diagram of a delay-locked loop (DLL) 100 that may be used in electronic circuits (e.g., the electronic device 10) to change the phase of a clock signal (e.g., to phase lock an input and an output signal, which may prevent or mitigate phase error). In particular, the DLL 100 may be part of or coupled to the local oscillator 66 of the transmitter 52 and/or the local oscillator 84 of the receiver 54. The DLL 100 includes a phase detector 102 that may receive an input signal at input 108 and an output signal from output 110 and may determine a first phase associated with the input signal and a second phase associated with the output signal. The phase detector 102 may determine a phase difference between the input phase and the output phase and may send an indication of the phase difference to a loop filter 104 electrically coupled to the phase detector 102. The loop filter 104 may remove unwanted components of the output signal of the phase detector 102, and may provide loop stability and transient response tracking.

The loop filter 104 is electrically coupled to a voltage-controlled delay line (VCDL) 106 that may adjust the phase of the output signal based on the phase difference determined by the phase detector by adjusting the delay of the signal through the VCDL 106. The VCDL 106 includes buffers 112A and 112N (collectively the buffers 112). In additional or alternative embodiments, the buffers 112 may include or be substituted with any suitable circuitry that delays the signal, including, for example, inverter circuits. The VCDL 106 includes a varactor 114A electrically coupled to the output of the buffer 112A and a varactor 114N electrically coupled to the output of the buffer 112N (the varactor 114A and the varactor 114N herein referred to as the varactors 114). Each buffer/varactor pair may constitute a delay stage of the VCDL 106. While only two delay stages are shown (e.g., only two buffers 112 and two varactors 114), the VCDL 106 may include any appropriate number of delay stages (e.g., 3 or more delay stages, 5 or more delay stages, 10 or more delay stages, 50 or more delay stages, and so on). The varactors 114 may be biased by the loop filter 104 to increase or decrease the delay of a signal through the VCDL 106 to adjust the phase of the output signal. The phase detector 102, the loop filter 104, and the VCDL 106 together may constitute an analog delay loop capable of providing fine-tuned changes to the phase of the output signal. For instance, the analog delay loop may provide smaller granularity changes than may be provided by coarse-tuning circuitry, as will be described in greater detail below. While the DLL 100 is shown to include varactors 114, it should be noted that the DLL 100 may include other forms of variable capacitor, such as a polarized variable capacitor.

In some cases, it may be desirable to increase the operating frequency range of the DLL 100. To increase an operating frequency range of the DLL 100, the size of the varactors 114 may be increased. However, increasing the size of the varactors 114 may consume excessive space on the DLL 100 and may lead to increased phase noise. To increase the operating frequency range of the DLL 100 with no increase or minimal increase to the size of the varactors 114 and/or the phase noise, a digital coarse-tuning delay loop may be implemented in the DLL 100.

Figure 6:
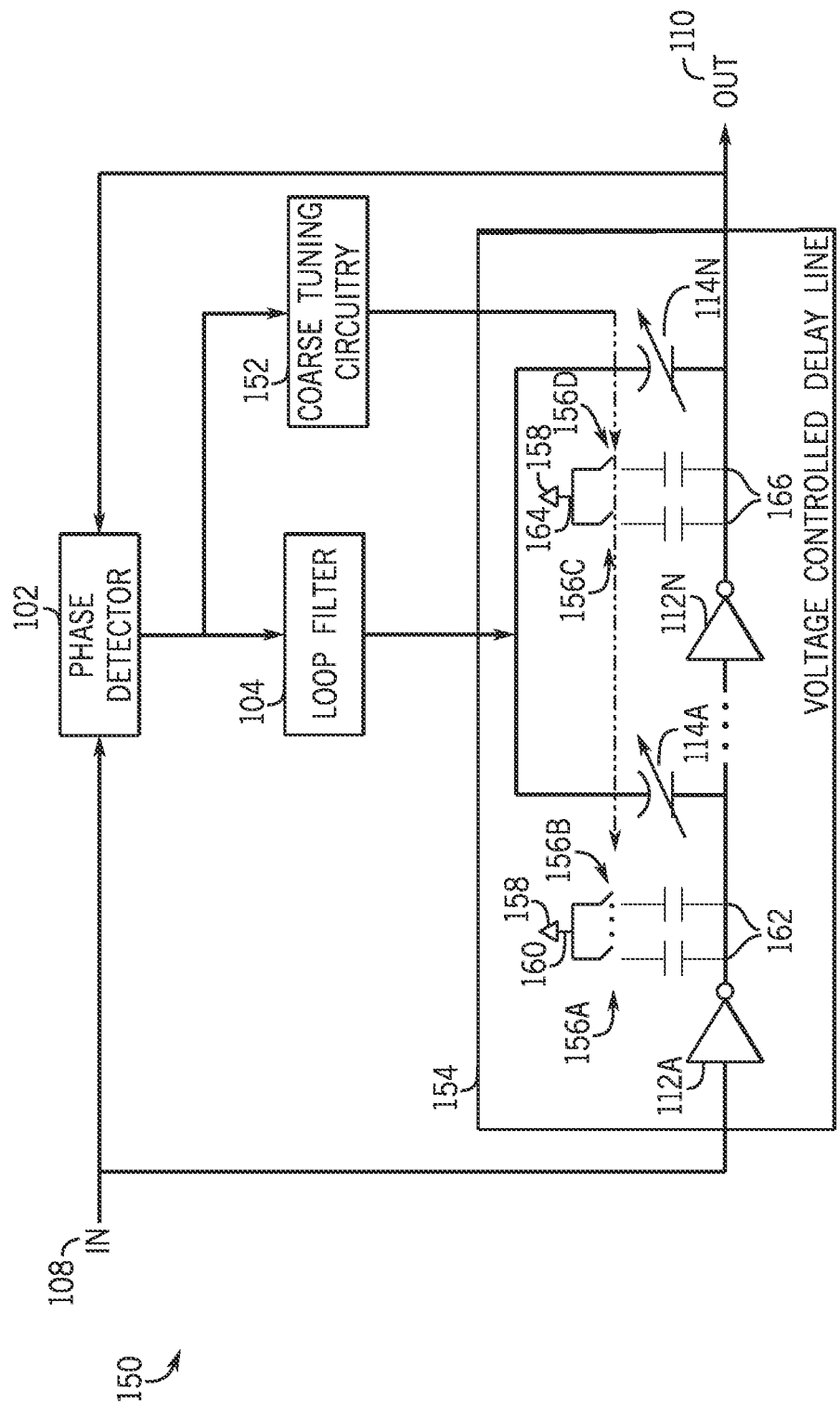
FIG. 6 is a schematic diagram of a DLL having coarse-tuning capabilities provided by coarse tuning circuitry, according to an embodiment of the present disclosure.

FIG. 6 is a schematic diagram of a DLL 150 having coarse-tuning capabilities, according to an embodiment of the present disclosure. Similar to the DLL 100 of FIG. 5, the DLL 150 includes an analog delay loop that includes the phase detector 102, the loop filter 104, and a VCDL 154, and a digital delay loop that includes the phase detector 102, coarse tuning circuitry 152 and the VCDL 154. The VCDL 154 includes the buffers 112, the varactors 114, a set of switched capacitors 156A and 156B coupled between the buffer 112A and the varactor 114A and a set of switched capacitors 156C and 156D coupled between the buffer 112N and the varactor 114N. The switched capacitors 156A, 156B, 156C, and 156D are referred to herein as the switched capacitors 156. The switched capacitors 156 may each include a switch (e.g., a transistor) coupled to a capacitor.

Each set of the switched capacitors 156 includes two or more switched capacitors 156 in parallel. The switched capacitor 156A is coupled in parallel to the switched capacitor 156B, and the switched capacitors 156A and 156B are coupled to a ground 158 at a first terminal 160 and an output of the buffer 112A and the varactors 114A at a second terminal 162. Similarly, the switched capacitor 206C is coupled in parallel to the switched capacitor 156D, and the switched capacitors 156C and 156D are coupled to the ground 158 at a first terminal 164 and are coupled to an output of the buffer 112N and the varactors 114N at a second terminal 166.

As previously mentioned, the DLL 150 includes a digital delay loop including the coarse tuning circuitry 152 coupled to the phase detector 102 and the VCDL 154. The coarse tuning circuitry 152 may operate in parallel with the loop filter 104 and may provide coarse-grain adjustments to the output signal at the output 110 of the DLL 150 to supplement the fine-grain adjustments provided by the loop filter 104. For instance, the coarse tuning circuitry 152 may provide larger-grain adjustments than may be provided by the analog delay loop as described above. The coarse tuning circuitry 152 may provide coarse-grain delay tuning of the output voltage signal by opening or closing the switched capacitors 156 of VCDL 154. For example, the coarse tuning circuitry 152 may increase the delay in the signal at the output 110 by coupling to or activating one or more of the switched capacitors 156. Conversely, the coarse tuning circuitry 152 may decrease the delay in the signal at the output 110 by decoupling from or deactivating one or more of the switched capacitors 156. The coarse-tuning circuitry 152 may be implemented in whole or in part as hardware, software, or a combination of both.

Figure 7:
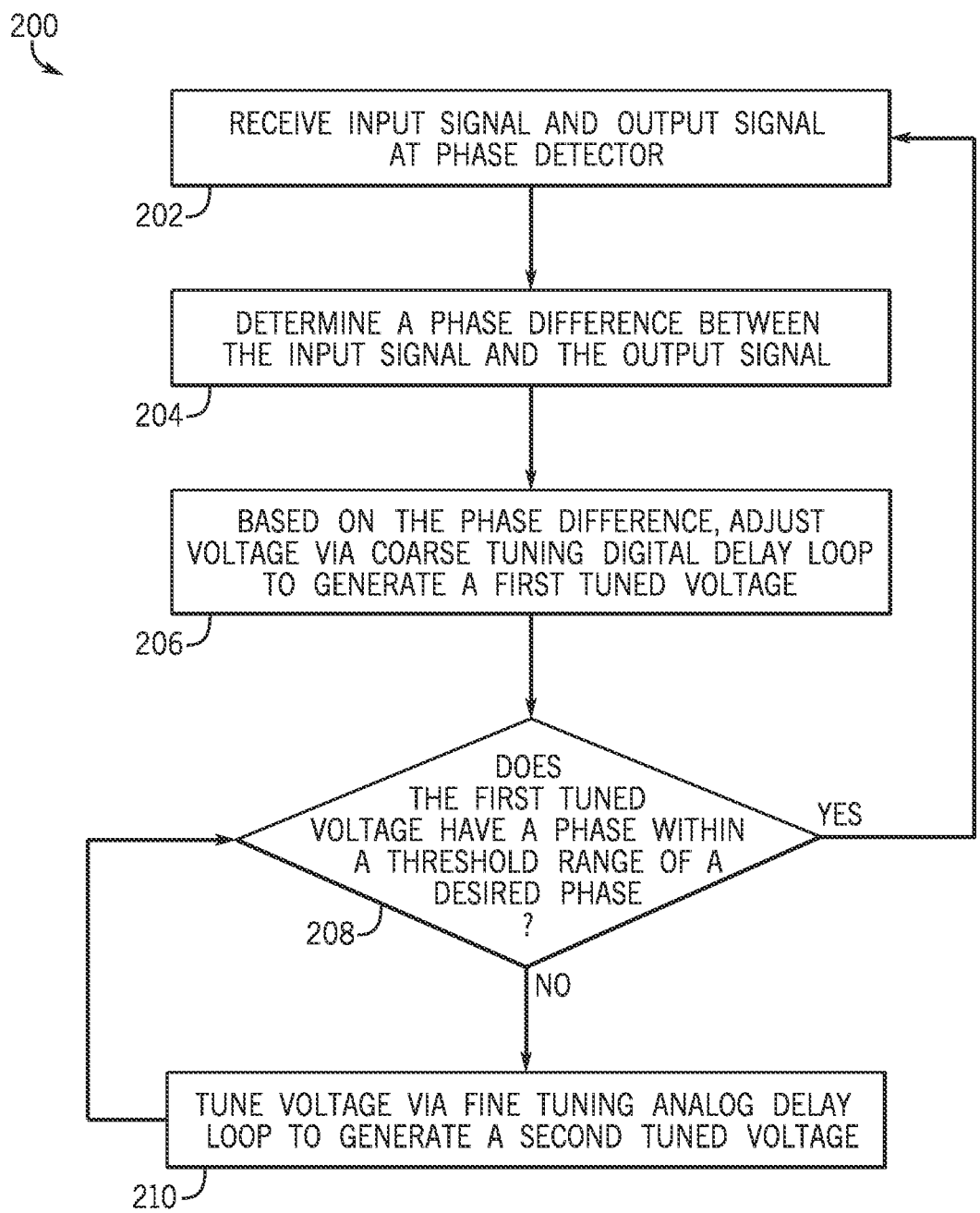
FIG. 7 is a flowchart of a method for adjusting the delay of the output signal of the DLL of FIG. 6, according to embodiments of the present disclosure.

FIG. 7 is a flowchart of a method 200 for adjusting the delay of the output signal of the DLL 150, according to embodiments of the present disclosure. Any suitable device (e.g., a controller, the processor 12) that may control components of the electronic device 10, such as the processor 12 may perform the method 200. In some embodiments, the method 200 may be implemented by executing instructions stored in a tangible, non-transitory, computer-readable medium, such as the memory 14 or storage 16, using the processor 12. For example, the method 200 may be performed at least in part by one or more software components, such as an operating system of the electronic device 10, one or more software applications of the electronic device 10, and the like. While the method 200 is described using steps in a specific sequence, it should be understood that the present disclosure contemplates that the described steps may be performed in different sequences than the sequence illustrated, and certain described steps may be skipped or not performed altogether.

In process block 202, the phase detector 102 of the DLL 150 may receive an input signal from the input 108 and an output signal from the output 110. In process block 204, the phase detector 102 may determine a phase difference between the input signal and the output signal. In process block 206, the DLL 150 may, based on the phase difference determined by the phase detector 102 in the process block 204, adjust the delay (e.g., thereby adjusting the phase) of the output signal via the coarse tuning circuitry 152 to generate an adjusted output signal. As discussed above, the coarse tuning circuitry 152 may increase or decrease the delay by coupling to or decoupling from the switched capacitors 156 of the VCDL 154. For example, the coarse tuning circuitry 152 may close switches of the switched capacitors 156 to increase the delay of the output signal, or may open switches of the switched capacitors 156 to decrease the delay of the output signal. The coarse tuning circuitry 152 may adjust the delay (e.g., thereby adjusting the phase) of the output signal to match the phase of the input signal, or to maintain a desired offset between the input signal and the output signal (e.g., to keep the output phase at ±180 degrees of the input phase).

In query block 208, the processor 12 may determine whether a phase of the first adjusted output signal is within a threshold range of a desired phase. For example, threshold range may include a phase error of ±2 degrees or more, ±5 degrees or more, ±10 degrees or more, and so on. If, in the query block 208, the processor 12 determines that the phase of the first adjusted output signal is within a threshold range of the desired phase, the method 200 may return to the process block 202 without further adjustment to the output signal. If, in the query block 208, the processor 12 determines that the phase of the first adjusted output signal is not within the threshold range of the desired phase, in process block 210, the processor 12 may cause the DLL 150 to adjust the phase of the output signal via the analog delay loop to generate a subsequent adjusted output signal. That is, the processor 12 may cause the loop filter 104 to bias the varactors 114A and/or 114N to increase or decrease the delay of the output signal on a fine-grain scale based on the phase difference determined by the phase detector 102. Once the analog delay loop has generated the subsequent adjusted output signal, the method 200 may return to the query block 208 to determine whether the phase of the output signal is within the threshold range of the desired phase. The method 200 may iteratively repeat until the phase of the output signal is within the threshold range of the desired phase (e.g., within a desired range of an input/output phase relationship). Once the phase of the output signal is within the threshold range of the desired phase, the DLL 150 may close the analog loop (e.g., may cause the loop filter 104 to stop biasing the varactors 114), may close the digital loop (e.g., may cause the coarse tuning circuitry to stop adjusting the switched capacitors 156), or both.

The coarse tuning circuitry 152 may provide several benefits to the DLL 150. For example, in some cases, such as regarding the DLL 100, there may be a tradeoff between tuning range of the DLL 100 and phase noise, such that as the tuning range increases (e.g., by increasing the size of the varactors 114) the phase noise also increases. However, as the coarse tuning circuitry 152 provides increased tuning range without increasing varactor size by adjusting loading of the sets of switched capacitors 156 over a wide range, the increase in phase noise associated with the increased tuning range may be reduced or eliminated. In another example, the coarse tuning circuitry 152 may improve output clock duty cycles. In some cases, such as regarding the DLL 100, the varactors 114 may be associated with a nonlinear capacitance that may cause duty cycle distortion. The reduced size of the varactors 114 in the DLL 150 may reduce duty cycle distortion.

In another example, the coarse tuning circuitry 152 may mitigate false locking in the DLL 150. In some cases, such as regarding the DLL 100, false locking may occur due to phase ambiguity. However, the coarse tuning circuitry 152 may enable greater control than the analog feedback loop, thus reducing the likelihood of false locking. In yet another example, the coarse tuning circuitry 152 may improve settling time of the DLL 150. During coarse tuning, the coarse tuning circuitry 152 may quickly adjust phase of the output signal of the DLL 150 to a desired value. When the analog loop begins, residual phase error (e.g., phase error remaining after adjustment by the coarse tuning circuitry 152) is much smaller than the initial phase error, thus improving settling time of the DLL 150.

Figure 8:
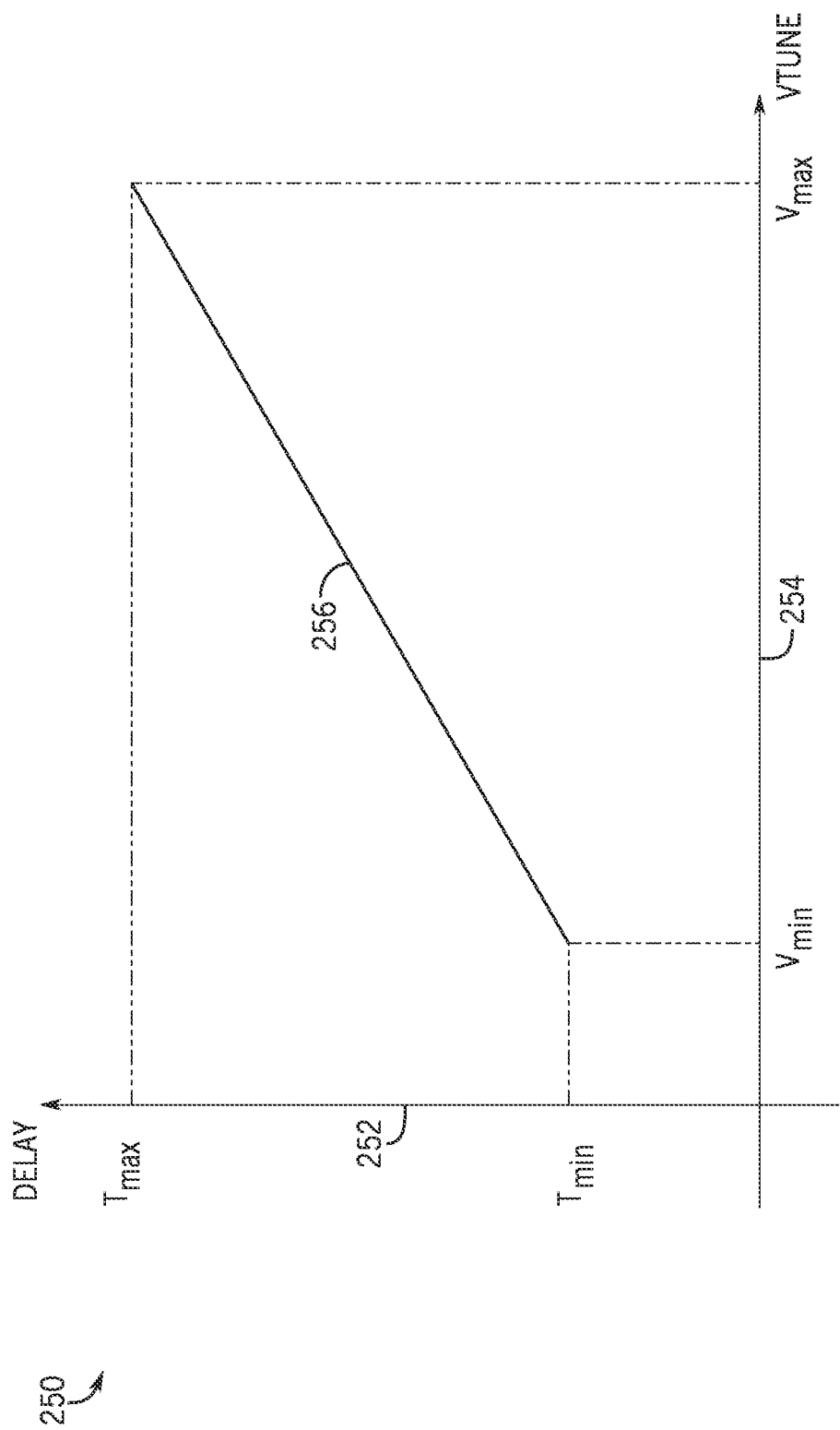
FIG. 8 is a graph illustrating operating behavior of the analog delay loop of the DLL.
Figure 9:
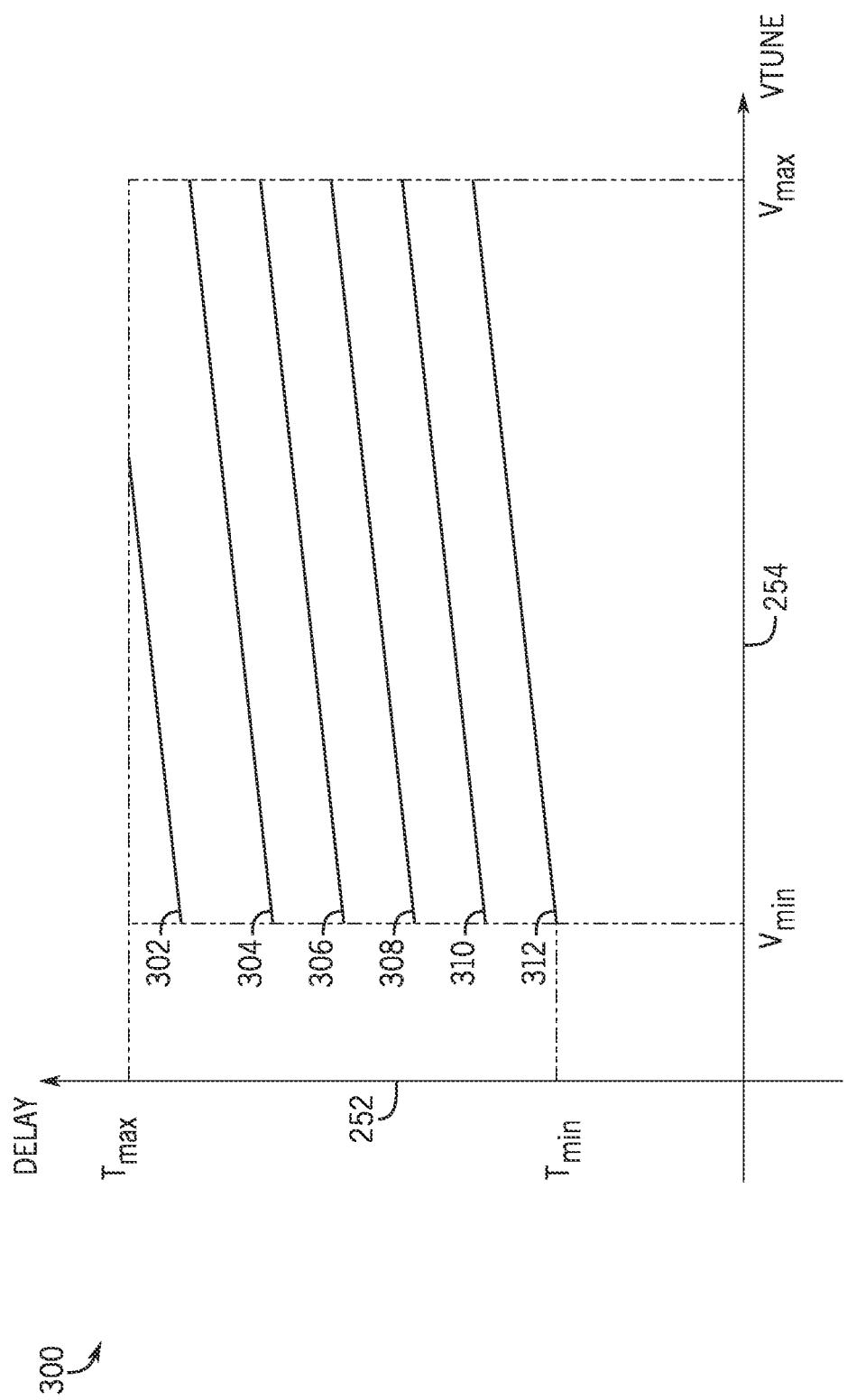
FIG. 9 is a graph illustrating operating behavior of the DLL of FIG. 6 when the coarse tuning circuitry is implemented, according to embodiments of the present disclosure.

FIG. 8 is a graph 250 illustrating operating behavior of the analog delay loop of the DLL 150. The graph 250 includes delay 252 on the vertical axis and voltage 254 on the horizontal axis. The curve 256 representing the voltage tuning applied to achieve a desired delay by the analog loop (e.g., the phase detector 102, the loop filter 104, and the VCDL 154) of the DLL 150 (e.g., without supplemental tuning from the coarse tuning circuitry 152). For example, the curve 256 may illustrate the voltage output that may be applied by the varactors 114 to provide the delay desired to cover process variation and temperature drift of the DLL 150. FIG. 9 is a graph 300 illustrating operating behavior of the DLL 150 when the coarse tuning circuitry is implemented, according to embodiments of the present disclosure. The graph 300 includes the curves 302, 304, 306, 308, 310, and 312, representing the voltage tuning applied by the to achieve a desired delay by the analog loop (e.g., the phase detector 102 and the loop filter 104) of the DLL 150. As may be appreciated, the curves 302, 304, 306, 308, 310, and 312 have shallower slopes than the curve 256, due to the analog loop adjusting for the residual phase error after the phase adjustment by the coarse tuning circuitry 152. For example, the curves 302, 304, 306, 308, 310, and 312 may represent the slopes of the voltage tuning by the analog loop when the coarse tuning circuitry 152 covers the delay associated with the process variation and the analog loop covers delay associated with temperature drift.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A delay-locked loop, comprising:
  a phase detector;
  a first loop comprising a loop filter coupled to the phase detector; and
  a second loop comprising:
    a plurality of switched capacitors; and
    coarse tuning circuitry coupled to the plurality of switched capacitors and the phase detector.

2. The delay-locked loop of claim 1, wherein a voltage-controlled delay line (VCDL) comprises the plurality of switched capacitors and one or more varactors, each of the one or more varactors comprising
  a buffer electrically coupled to the plurality of switched capacitors, and
  a variable capacitor.

3. The delay-locked loop of claim 2, wherein the variable capacitor comprises a polarized variable capacitor.

4. The delay-locked loop of claim 2, wherein the coarse tuning circuitry is configured to tune an output signal of the VCDL, and wherein the variable capacitor is configured to close an analog loop after the coarse tuning circuitry completing tuning.

5. The delay-locked loop of claim 2, wherein the plurality of switched capacitors is coupled in parallel.

6. The delay-locked loop of claim 2, wherein the plurality of switched capacitors is coupled to an electrical ground at a first node and coupled to the buffer and the variable capacitor at a second node.

7. The delay-locked loop of claim 1, wherein the coarse tuning circuitry is configured to tune a phase of an output signal based on adjusting the plurality of switched capacitors.

8. A method, comprising:
  receiving an indication of a phase of an input signal from a phase detector;
  activating, via tuning circuitry, a first plurality of switches based on the indication of the phase to electrically couple a first plurality of capacitors to a first plurality of buffers and to a plurality of polarized variable capacitors to adjust a phase delay; and
  inputting the input signal to the first plurality of buffers to apply the phase delay.

9. The method of claim 8, comprising deactivating, via the tuning circuitry, a second plurality of switches based on the indication of the phase to electrically decouple a second plurality of capacitors from a second plurality of buffers to adjust the phase delay.

10. The method of claim 8, wherein coupling the first plurality of capacitors to the first plurality of buffers increases the phase delay.

11. The method of claim 8, comprising:
  receiving another indication of a difference between a first phase of the input signal and a second phase of an output signal; and
  biasing one or more varactors to adjust the phase delay based on the difference.

12. The method of claim 11, comprising biasing the one or more varactors in response to determining that the phase delay is not within a threshold range of a desired phase delay.

13. A device, comprising:
  a plurality of antennas; and
  a transceiver coupled to the plurality of antennas, the transceiver comprising
    a phase detector,
    a loop filter coupled to the phase detector,
    a voltage-controlled delay line (VCDL) electrically coupled to the loop filter and comprising a plurality of switched capacitors, and
    coarse tuning circuitry directly coupled to the phase detector and the VCDL, the coarse tuning circuitry configured to apply a first phase adjustment to an output signal of the VCDL by adjusting the plurality of switched capacitors based on an output of the phase detector.

14. The device of claim 13, wherein the VCDL comprises
  a buffer electrically coupled to the plurality of switched capacitors, and
  a variable capacitor.

15. The device of claim 14, wherein the phase detector, the loop filter, the buffer, and the variable capacitor comprise an analog delay loop configured to apply a second phase adjustment to the output signal of the VCDL.

16. The device of claim 15, wherein the analog delay loop is configured to apply the second phase adjustment based on a phase of the output signal being outside of a threshold range of a desired phase.

17. The device of claim 15, wherein the second phase adjustment comprises a finer-grain phase adjustment than the first phase adjustment.

18. The device of claim 15, wherein the second phase adjustment is provided based on the loop filter biasing the variable capacitor of the VCDL.

19. The device of claim 18, wherein the plurality of switched capacitors are coupled to the buffer and the variable capacitor at a first node and coupled to an electrical ground at a second node.

20. The delay-locked loop of claim 1, wherein the first loop is configured to provide a first adjustment to a phase of a signal via one or more varactors and the second loop is configured to provide a second adjustment to the phase of the signal via the plurality of switched capacitors.

\* \* \* \* \*